United States Patent
Lasseuguette et al.

(10) Patent No.: US 10,972,848 B2
(45) Date of Patent: Apr. 6, 2021

(54) MEMS TRANSDUCER SYSTEM AND ASSOCIATED METHODS

(71) Applicant: Cirrus Logic International Semiconductor Ltd., Edinburgh (GB)

(72) Inventors: Jean Pierre Lasseuguette, Edinburgh (GB); Aleksey Sergeyevich Khenkin, Austin, TX (US); Axel Thomsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/598,799

(22) Filed: Oct. 10, 2019

(65) Prior Publication Data
US 2020/0045485 A1    Feb. 6, 2020

Related U.S. Application Data

(63) Continuation of application No. 15/938,665, filed on Mar. 28, 2018, now Pat. No. 10,511,923.
(Continued)

(30) Foreign Application Priority Data

Oct. 11, 2017   (GB) .................................. 1716670

(51) Int. Cl.
*H04R 29/00*    (2006.01)
*B81B 7/00*    (2006.01)
(Continued)

(52) U.S. Cl.
CPC ........... *H04R 29/004* (2013.01); *B81B 7/008* (2013.01); *B81C 99/003* (2013.01);
(Continued)

(58) Field of Classification Search
CPC .... H04R 29/004; H04R 29/00; H04R 19/005; H04R 19/04; H04R 2201/003;
(Continued)

(56) References Cited

U.S. PATENT DOCUMENTS 3,469,255 A * 9/1969 Barbour ............... G11C 27/026
                                              341/108
8,040,143 B2    10/2011 Nascimento
(Continued)

FOREIGN PATENT DOCUMENTS

GB       2298048 A    8/1996
GB       2466785 A    7/2010
(Continued)

OTHER PUBLICATIONS

Search Report under Section 17(6), UKIPO, Application No. GB1716670.3, dated Oct. 21, 2019.
(Continued)

*Primary Examiner* — Ahmad F. Matar
*Assistant Examiner* — Sabrina Diaz
(74) *Attorney, Agent, or Firm* — Jackson Walker L.L.P.

(57) ABSTRACT

The disclosure provides a system, comprising: a MEMS capacitive transducer, comprising one or more first capacitive plates coupled to a first node and one or more second capacitive plates coupled to a second node; biasing circuitry coupled to the first node, operable to provide a biasing voltage to the one or more first capacitive plates; and test circuitry coupled to the second node, operable to: selectively apply one or more current sources to the second node, so as to charge and discharge the MEMS capacitive transducer and so vary a signal based on a voltage at said second node between an upper value and a lower value; determine a parameter that is indicative of a time period of the variation of the signal; and determine a capacitance of the MEMS
(Continued)

capacitive transducer based on the parameter that is indicative of the time period.

17 Claims, 4 Drawing Sheets

Related U.S. Application Data

(60) Provisional application No. 62/479,684, filed on Mar. 31, 2017.

(51) Int. Cl.
  B81C 99/00 (2010.01)
  *H04R 19/04* (2006.01)
  *H04R 19/00* (2006.01)

(52) U.S. Cl.
  CPC ... *B81B 2201/0257* (2013.01); *B81B 2207/03* (2013.01); *H04R 19/005* (2013.01); *H04R 19/04* (2013.01); *H04R 2201/003* (2013.01)

(58) Field of Classification Search
  CPC ............ B81B 7/008; B81B 2201/0257; B81B 2207/00; B81B 2207/01; B81B 2207/03
  USPC .......................................................... 381/58
  See application file for complete search history.

(56) References Cited

U.S. PATENT DOCUMENTS

| | | |
|---|---|---|
| 2005/0226478 A1 | 10/2005 | Fujiyoshi |
| 2010/0219839 A1 | 9/2010 | Steele et al. |
| 2013/0263665 A1* | 10/2013 | Opris ................ G01C 19/5776 73/504.12 |
| 2015/0233995 A1 | 8/2015 | Pratap et al. |
| 2017/0089966 A1 | 3/2017 | Birk et al. |
| 2017/0307668 A1 | 10/2017 | Buffa et al. |
| 2019/0202199 A1 | 7/2019 | Bird et al. |

FOREIGN PATENT DOCUMENTS

| | | |
|---|---|---|
| GB | 2513406 A | 10/2014 |
| WO | 2006130828 A2 | 12/2006 |

OTHER PUBLICATIONS

Search Report under Section 17(6), UKIPO, Application No. GB1716670.3, dated Oct. 18, 2019.

Alferink, F., "Measuring capacitance & ESR", Meettechniek.info, https://meetechniek.info/passive/capacitance.html.

Combined Search and Examination Report, UKIPO, Application No. GB1716670.3, dated Mar. 26, 2018.

Combined Search and Examination Report under Sections 17 and 18(3), UKIPO, Application No. GB2006041.4, dated Jun. 1, 2020.

* cited by examiner

MEMS TRANSDUCER SYSTEM AND ASSOCIATED METHODS

The present disclosure claims priority to U.S. Non-Provisional patent application Ser. No. 15/938,665, filed Mar. 28, 2018, which claims priority to U.S. Provisional Patent Application Ser. No. 62/479,684, filed Mar. 31, 2017, and United Kingdom Patent Application Serial No. 1716670.3, filed Oct. 11, 2017, each of which is incorporated by reference herein in its entirety.

TECHNICAL FIELD

Embodiments of the present disclosure relate to MEMS transducers and associated circuitry, and to apparatus and methods for determining the capacitance of such transducers.

BACKGROUND

Consumer electronics devices are continually getting smaller and, with advances in technology, are gaining ever-increasing performance and functionality. This is clearly evident in the technology used in consumer electronic products such as mobile phones, laptop computers, MP3 players and tablets. Requirements of the mobile phone industry, for example, are driving the components to become smaller with higher functionality and reduced cost. It is therefore desirable to integrate functions of electronic circuits together and combine them with transducer devices such as microphones and speakers.

The result of this is the emergence of microelectromechanical (MEMS) based transducer devices. These may be, for example, capacitive transducers for detecting and/or generating pressure/sound waves or transducers for detecting acceleration. MEMS capacitive microphones typically comprise a first electrode, which is moveable with respect to a second fixed electrode in response to incident acoustic waves. The first electrode may, for example, be supported by a flexible membrane. By measuring changes in the capacitance between the electrodes, the incident acoustic signals can be detected. In use, the electrodes of the MEMS microphone may be biased by biasing circuitry and the measurement signal may be amplified by amplifier circuitry such as a low-noise amplifier. MEMS transducers may also be designed to operate in the reverse mode of operation, in which electrical signals are applied to one or both of the electrodes to drive motion of the flexible membrane and so generate pressure/sound waves.

Although the process for manufacturing MEMS components has improved with the considerable research and development that has taken place in recent years, the uniformity of devices produced by such processes is still a significant issue for the industry. Inevitably, minor differences will exist between MEMS components even if they are manufactured by the same process. In the field of MEMS capacitive transducers, this can result in variation between the capacitance of individual components.

Further, it is known that the quiescent capacitance of a MEMS transducer (i.e. the capacitance when the transducer is not subject to incoming pressure waves, or driving input signals) may change over time, based on a number of factors such as the amount of use the transducer is subject to, the amplitude of signals used to drive the transducer, or the amplitude of pressure/sound waves detected by the transducer, and environmental conditions such as temperature and humidity.

As such, it is useful to be able to determine the capacitance value of the MEMS transducer, following manufacture (e.g. using external test circuitry in the laboratory or manufacturing plant), during use (e.g. using test circuitry on-chip, within the same package in which the transducer is housed or, more generally, within the same host device in which the MEMS transducer is used) or both. The capacitance value may be used to adjust the biasing voltage applied to the electrodes, or otherwise calibrate the input/output signals applied to or generated by the MEMS transducer so as to achieve a consistent performance from sample to sample or over time.

Methods and apparatus for determining the capacitance of a MEMS transducer are therefore required.

SUMMARY

According to a first aspect of the disclosure, there is provided a system, comprising: a MEMS capacitive transducer, comprising one or more first capacitive plates coupled to a first node and one or more second capacitive plates coupled to a second node; biasing circuitry coupled to the first node, operable to provide a biasing voltage to the one or more first capacitive plates; and test circuitry coupled to the second node, operable to: selectively apply one or more current sources to the second node, so as to charge and discharge the MEMS capacitive transducer and so vary a signal based on a voltage at said second node between an upper value and a lower value; determine a parameter that is indicative of a time period of the variation of the signal; and determine a capacitance of the MEMS capacitive transducer based on the parameter that is indicative of the time period.

In another aspect, there is provided a system, comprising: a MEMS capacitive transducer, comprising one or more first capacitive plates coupled to a first node and one or more second capacitive plates coupled to a second node; biasing circuitry coupled to the first node, operable to provide a biasing voltage to the one or more first capacitive plates; output circuitry coupled to the second node, for generating an output signal; and capacitive circuitry coupled to the first node, comprising a charge amplifier arranged in a feedback loop, the feedback loop further comprising a first capacitor coupled to an output of the charge amplifier, such that an effective capacitance of the first capacitor is increased based on a gain of the charge amplifier.

A further aspect provides an amplifier circuit for a MEMS capacitive transducer, the amplifier circuit comprising: an amplifier for providing an amplifier output signal based on a voltage of an electrode of the MEMS capacitive transducer; one or more current sources controllable to apply a current to an electrode of the MEMS capacitive transducer, so as to charge or discharge the MEMS capacitive transducer and so vary the voltage of said electrode between upper and lower values; a comparator for providing a comparator output signal based on comparing the amplifier output signal to at least one of the upper and lower values; and control circuitry for controlling the application of said one or more current sources based on the comparator output signal.

The disclosure further provides an electronic device, comprising a system or amplifier circuit as recited above.

Another aspect provides test circuitry for measurement of the capacitance of a MEMS capacitive transducer, operable to: selectively apply one or more current sources to an electrode of the MEMS capacitive transducer, so as to charge and discharge the MEMS capacitive transducer and so vary a voltage of said electrode between upper and lower values; determine a parameter that is indicative of a time period of the variation of the signal based on the voltage of said electrode; and determine a capacitance of the MEMS capacitive transducer based on the parameter that is indicative of the time period.

There is also provided a method for determining the capacitance of a MEMS capacitive transducer, the MEMS capacitive transducer comprising one or more first capacitive plates coupled to a first node and one or more second capacitive plates coupled to a second node, the method comprising: providing a biasing voltage to the one or more first capacitive plates; selectively applying one or more current sources to the second node, so as to charge and discharge the MEMS capacitive transducer and so vary a signal based on a voltage at said second node between an upper value and a lower value; determine a parameter that is indicative of a time period of the variation of the signal; and determine a capacitance of the MEMS capacitive transducer based on the parameter that is indicative of the time period.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
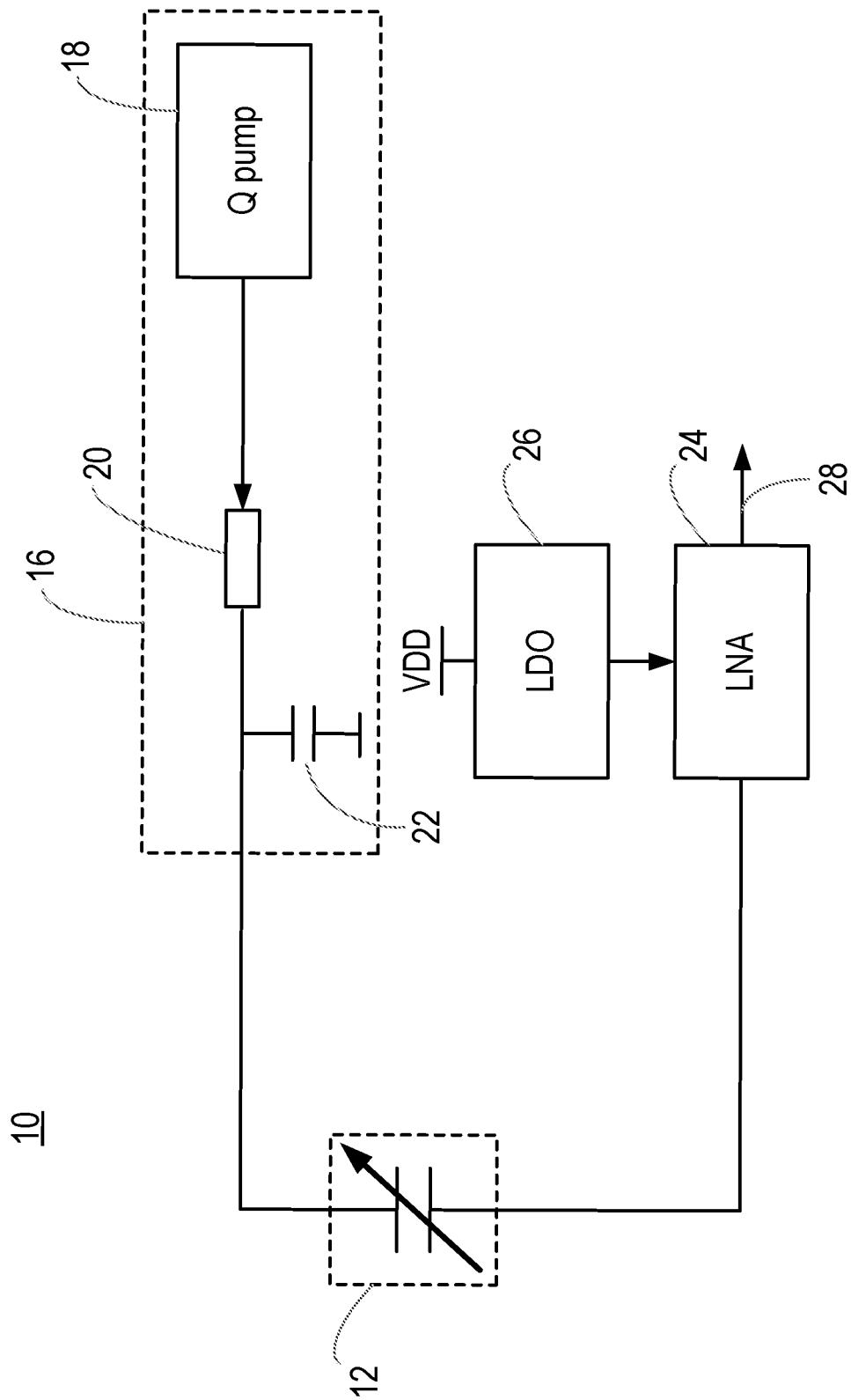
FIG. 1 shows MEMS transducer circuitry.

FIG. 1 shows an example of MEMS transducer circuitry 10, in which the MEMS transducer is operable as a microphone.

A MEMS transducer 12 comprises a first capacitive plate and a second capacitive plate (also referred to herein as electrodes). The first capacitive plate may be embedded within or otherwise attached to a flexible membrane, while the second capacitive plate may be embedded within or otherwise attached to a fixed backplate structure. The transducer 12 may thus be configured such that an incoming pressure wave or sound wave causes displacement of the flexible membrane (and hence the first capacitive plate) relative to the fixed backplate structure (and hence the second capacitive plate).

The transducer 12 may comprise more than one plate embedded within or otherwise attached to the flexible membrane, and/or more than one capacitive plate embedded within or otherwise attached to the fixed backplate. Where the following description refers to a first capacitive plate and a second capacitive plate, therefore, it will be understood that such references also relate to a plurality of first capacitive plates and a plurality of second capacitive plates.

A first plate of the MEMS transducer 12 is arranged to receive a bias voltage $V_{bias}$, typically 12V or so, from biasing circuitry 16. A low-noise amplifier 24 has an input connected to the second plate of the MEMS transducer 12. This plate may also be connected to a high-value (typically of the order of 10 Gohm or greater) bias resistance to bias this terminal to ground without shorting out the audio band signal. The bias resistance may often be implemented in the form of polysilicon diodes.

The biasing circuitry 16 comprises a charge pump 18 arranged to generate the required relatively high bias voltage $V_{bias}$ from a lower voltage input. Typically the charge pump 18 generates a bias voltage $V_{bias}$ which is equal to a multiple of the voltage applied to its input. It will be appreciated therefore that were the charge pump input connected directly to the voltage supply for an integrated circuit, then the bias voltage across the transducer would vary with the applied supply voltage. Also any noise on the supply would be similarly multiplied and couple via the MEMS capacitance into the amplifier 24, and would therefore be indistinguishable from any acoustically generated signals. Thus the voltage input for the charge pump 18 is preferably a supply-independent voltage $V_R$. The reference voltage $V_R$ may be generated by a reference generator circuit (not illustrated) which will typically include a bandgap voltage reference generator. As will be understood by one skilled in the art a bandgap voltage reference generator can generate a reference voltage that is independent of variations of the supply voltage and which is also substantially temperature stable.

Nonetheless, the voltage output from the charge pump 18 may comprise an element of high-frequency noise. Thus biasing circuitry 16 may further comprise a resistor 20 coupled in series between the output of the charge pump 18 and the first plate of the MEMS transducer 12, and a capacitor 22 coupled between the first plate of the MEMS transducer 12 and a reference voltage such as ground. Together, the resistor 20 and the capacitor 22 form a low-pass filter which acts to filter out the high-frequency noise. The resistor 20 may again comprise poly-silicon diodes in order to achieve a suitable high impedance value. Those skilled in the art will appreciate that alternative filters may be provided. For example, the filter may comprise a low-pass filter (in the illustrated form or different) or a suitably configured band-pass filter.

The low-noise amplifier 24 is coupled to the second plate of the transducer 12, and thus receives the signal generated by the transducer 12 upon movement of the plates relative to each other. The low-noise amplifier 24 may be supplied from a power source VDD, via a low drop-out regulator 26. The amplifier signal 28 is then output from the circuitry for further processing as required.

Of course, the MEMS transducer circuitry 10 shown in FIG. 1 has a mechanism for measuring changes in capacitance of the transducer 12 (or for measuring changes in a variable that depends on the capacitance) as a result of incoming pressure waves and consequential movement of the plates relative to each other. However, the circuitry 10 comprises no mechanism for determining the quiescent capacitance of the MEMS transducer 12, i.e. when the transducer is not subject to such incoming pressure waves. A further problem is in the design of the circuitry coupled to the first plate of the transducer 12. For example, in order to ensure that the signal generated by the transducer 12 and read out from the second plate is an accurate reflection of an incoming pressure wave, the voltage at the first plate should remain fixed at the biasing voltage, i.e. the first plate should be an AC ground, such that the offset of an alternating signal generated by motion of the MEMS transducer plates is fixed at the reference voltage $V_{bias}$. The capacitance 22 can be increased so as to maintain a constant AC ground; however, large capacitors utilize significant area on an integrated circuit and are therefore undesirable.

Figure 2:
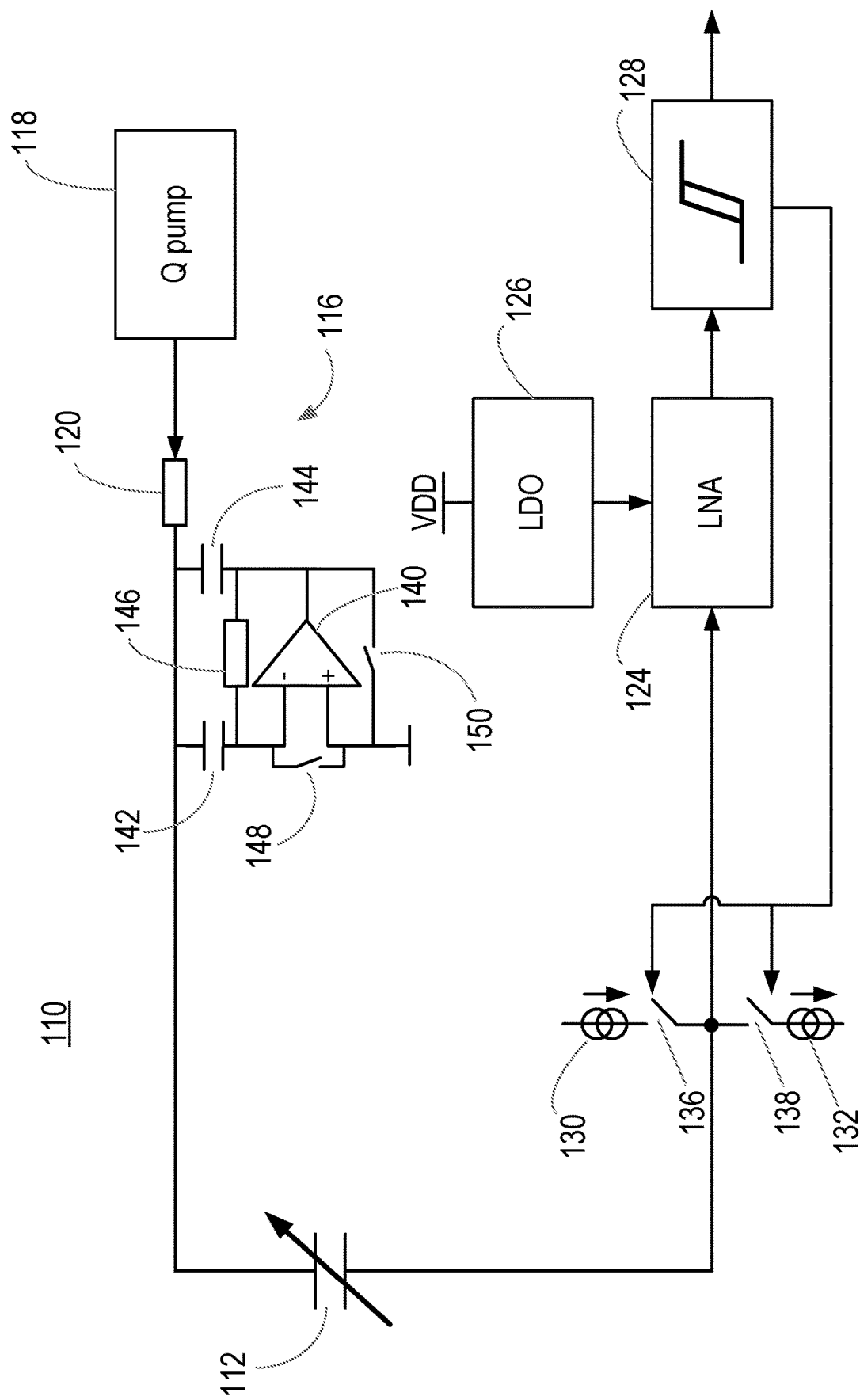
FIG. 2 shows MEMS transducer circuitry according to embodiments of the disclosure.

FIG. 2 shows MEMS transducer circuitry 110 that addresses both of these problems, i.e. providing a mechanism by which the capacitance of the transducer can be determined, and providing circuitry that is configured to ensure the first plate of the transducer is maintained at a fixed voltage. In some embodiments of the disclosure, however, only one of the problems is addressed. That is, in some embodiments, the mechanism for determining the capacitance of the transducer may be provided, but not the circuitry configured to ensure the first plate of the transducer is coupled to a fixed voltage; in other embodiments, circuitry is provided to ensure that the first plate of the transducer is coupled to a fixed voltage, but no mechanism for determining the capacitance of the transducer.

The circuitry 110 comprises a MEMS capacitive transducer 112. As with the transducer 12 discussed above with respect to FIG. 1, the transducer 112 comprises first and second capacitive plates that are movable with respect to each other, for example in response to an incident pressure wave or sound wave. One of the plates may be coupled to (e.g. mounted on or embedded within) a flexible membrane, while the other plate may be coupled to a fixed backplate structure. Incident pressure or sound waves deflect the flexible membrane and so cause a change in capacitance of the transducer 112.

A first terminal of the MEMS transducer 112 (which may be coupled to the first, movable capacitive plate or the second, fixed capacitive plate) is arranged to receive a bias voltage $V_{bias}$ from biasing circuitry 116. During conventional use, i.e. when the transducer 112 is used as a microphone to detect incoming pressure or sound waves, the bias voltage may be in the region of 12V. However, in other modes the bias voltage may be varied. For example, a plurality of different bias voltages may be applied in order to determine the variation with bias voltage of the capacitance of the transducer 112, e.g. as described below with respect to FIG. 4.

The biasing circuitry 116 comprises a charge pump 118 arranged to generate the required relatively high bias voltage $V_{bias}$, and a resistor 120 forming part of a filter configured to filter the high-frequency noise from the charge pump output. These components may be substantially similar to their counterparts in FIG. 1.

A second terminal of the MEMS transducer 112 is coupled to a low-noise amplifier 124. This terminal may also be connected to a high-value (typically of the order of 10 Gohm or greater) bias resistance to bias this terminal to ground without shorting out the audio band signal. The bias resistance may be implemented in the form of polysilicon diodes.

The low-noise amplifier 124 is coupled to the second plate of the transducer 112, and thus receives the signal generated by the transducer 112 upon movement of the plates relative to each other. The low-noise amplifier 124 may be supplied from a power source VDD, via a low drop-out regulator 126.

In order to determine the capacitance of the transducer 112, the circuitry further comprises comparator circuitry 128 coupled to the output of the amplifier 124, operable to compare the output of the amplifier 124 to one or more threshold voltages and provide respective control signals for first and second switches 136 and 138 based on the comparison. For example, in one embodiment, the comparator circuitry 128 is configured to compare the output of the amplifier 124 to an upper threshold voltage and a lower threshold voltage (which is lower than the upper threshold voltage), and generate control signals for the switches when the output of the amplifier 124 reaches the upper threshold voltage and/or when the output of the amplifier 124 reaches the lower threshold voltage.

In one embodiment, the comparator circuitry 128 comprises a Schmitt trigger, which is a circuit designed to output a logical high value when an input signal is higher than a chosen upper threshold, and a logical low value when an input signal is lower than a chosen lower threshold (which is lower than the upper threshold). In between the two thresholds, the output of the circuit retains its value. However, alternative comparator circuits may be used to achieve the same result, without departing from the scope of the claims appended hereto.

The first switch 136 couples a first current source 130 to the second terminal of the transducer 112, while the second switch 138 couples a second current source 132 to the second terminal. The current sources 130, 132 may be arranged such that one current source (in the illustrated embodiment, the first current source 130) acts to charge the second plate of the transducer, while the other current source (in the illustrated embodiment, the second current source 132) acts to discharge the second plate of the transducer 112.

As used herein, the term "current source" covers any electronic circuit or component that provides a substantially constant current. Many different implementations will be known to those skilled in the art. For example, a current source may comprise a transistor operable to provide a current-stable output characteristic, or more than one transistor arranged as a current mirror. The current source may also comprise a resistance coupled to a voltage source (such as a supply voltage or a voltage based on a supply voltage). Further, it will be understood herein that the term "current source" covers both current sources and current sinks.

In order to sense the capacitance of the transducer 112, the current sources 130, 132 may be selectively coupled to and uncoupled from the second terminal of the transducer so as to charge and discharge the transducer 112 between upper and lower voltages. Thus, the first current source 130 is coupled to the transducer 112 (and the second current source 132 uncoupled) in order to increase the voltage output from the transducer 112, i.e. switch 136 is closed, while switch 138 is open. The comparator circuitry 128 receives the output of the amplifier 124 and, when the signal reaches a defined upper value, generates control signals that open the first switch 136 and close the second switch 138, i.e. uncoupling the first current source 130 from the transducer 112 and coupling the second current source 132 to the transducer 112. The transducer thus discharges, causing the output signal of the amplifier 124 to drop. When the signal reaches a defined lower value, the comparator circuitry 128 generates control signals that close the first switch 136 and open the second switch 138, i.e. coupling the first current source 130 to the transducer 112 and uncoupling the second current source 132 from the transducer 112.

Those skilled in the art will appreciate that alternative configurations than those shown in FIG. 2 may be utilized to achieve substantially the same result. For example, in one alternative embodiment, a single current source may be utilized to charge and discharge the transducer 112, by altering the polarity of the connection between the current source and the second terminal of the transducer 112 instead of coupling and decoupling multiple current sources. Alternatively, the single current source may be used only to charge the transducer 112, with the transducer being allowed to discharge more slowly to ground (i.e. without the assistance of a current sink) when the current source is uncoupled from the transducer. In this latter embodiment, the signal generated by the transducer 112 is non-symmetrical, as the transducer 112 will charge and discharge at different rates.

In further embodiments, one or more of the current sources 130, 132 may be coupled to the transducer 112 for a fixed time period, rather than until the signal output from the transducer reaches a threshold. For example, in one embodiment, the transducer 112 may be charged until the output signal reaches an upper threshold value, and then discharged (e.g. through the application of a current source or through discharging to ground) for a fixed time period (e.g. a sufficiently long period that the output signal falls below the lower threshold). In an alternative embodiment, the transducer 112 may be charged for a fixed time period by coupling of a current source to the transducer (e.g. a sufficiently long period that the output signal rises above the upper threshold), and then discharged until the output signal falls below the threshold. In yet further embodiments, the transducer 112 may be charged for a fixed period, and discharged for a fixed period.

Thus a cycle is completed of charging followed by discharging, between defined lower and upper voltages. It will be understood that the cycle may equally be defined by first discharging and then re-charging the transducer. The capacitance of the transducer 112 is related to the period of such a cycle by the following equation:

$$C_{MEMS} = \frac{2I_{ref}T_{osc}}{(V_H - V_L)}$$

where $C_{MEMS}$ is the capacitance of the MEMS transducer 112, $I_{ref}$ is the current flowing in the current sources (assuming that the same current flows in each of the current sources 130, 132), $T_{osc}$ is the period of the cycle, $V_H$ is the upper voltage and $V_L$ is the lower voltage. The equation assumes that the gain of the amplifier 124 is unity. Otherwise, the gain of the amplifier may also be taken into account in the equation (e.g. by appearing in the numerator of the equation set out above).

It will also be appreciated by those skilled in the art that the equation above assumes charging and discharging of the transducer at the same rate, i.e. the transducer is charged by action of a current source providing current $I_{ref}$, and discharged by a current source providing current $I_{ref}$. As noted above, however, in alternative embodiments the transducer may be charged and discharged at different rates, either through the application of different currents for charging and discharging, or by application of a single current for charging or discharging, before returning to the quiescent voltage by action of the biasing voltage and ground. In such embodiments, the equation may change correspondingly. For example, instead of measuring the entire period of the cycle, only part of the period may be measured, e.g. corresponding to the time taken to charge or discharge the transducer between upper and lower voltages by application of $I_{ref}$. The capacitance of the transducer 112 may then be found by multiplying the measured by an appropriate factor to recover the "full" period of the cycle, or by modifying the equation to account for the partial period that is measured.

In practice, the transducer 112 may be repeatedly charged and discharged so that multiple cycles take place sequentially (i.e. an oscillation takes place in the signal). In such embodiments, the frequency of the oscillation may be chosen as follows.

The transducer 112 may be modelled as a parallel-plate capacitor, in which the capacitance depends on the area of the plates, the distance between the plates, and the electric permittivity of the material between the plates: in general, the greater the permittivity and the area, the higher the capacitance; the greater the distance between the plates, the lower the capacitance.

Thus the capacitance depends on the distance between the plates of the transducer 112; however, by the very nature of the transducer, the plates are moveable with respect to each other and thus the distance between them will vary. In order to measure the capacitance of the transducer accurately, it may be important to ensure that the plates do not move as a result of the charging-discharging cycle described above. Thus the value of the current flowing in the current sources 130, 132 may be chosen such that the frequency of the oscillation is significantly higher than mechanical resonant frequencies of the transducer. As the frequency of the oscillation is proportional to the current flowing in the current sources (see equation above), the current value may therefore be set sufficiently high above the resonant frequency of the transducer 112 such that the plates do not appreciably move (e.g. due to the mass of the moving plate(s), air resistance in a port hole, etc). The process of charging and discharging the transducer may also be carried out in a test environment or otherwise at a time when substantially no pressure waves or sound waves are being detected (i.e. the plates of the transducer are not moving due to an incoming pressure wave or sound wave).

The circuitry 110 further comprises capacitive circuitry that establishes a fixed voltage (i.e. a reference voltage) at the first plate of the transducer 112. The capacitive circuitry comprises a charge amplifier 140 and first and second capacitors 142, 144 arranged in a feedback loop. A non-inverting input of the amplifier 140 is coupled to ground, while an inverting input of the amplifier is coupled to the first plate of the transducer (which receives the biasing voltage from biasing circuitry 116) via the first capacitor 142. The first capacitor is operable to shift the DC component of the signal present at the first plate of the transducer to a lower level (e.g. from the order of 12 V to 0 or 1 V). An output of the amplifier 140 is also coupled to the first plate of the transducer 112, via the second capacitor 144.

A resistance 146 is further coupled between the output of the amplifier 140 and the inverting input, i.e. in parallel with the first and second capacitors 142, 144. The resistance 146 may comprise a poly diode resistance, operable to stabilize the DC operating point of the amplifier 140.

The arrangement of capacitive circuitry, and particularly the arrangement of the amplifier 140, the second capacitor 144 at its output, and the feedback loop, utilizes the Miller effect to increase the equivalent input capacitance of the amplifier 140. It can be shown that the configuration of the second capacitor 144 in a feedback arrangement to the inverting input of the amplifier 140 amplifies the effective capacitance of the second capacitor 144 by a factor equal to (1+g), where g is the gain of the amplifier 140. The increase in capacitance can be approximated to g, where g>>1. In practice, the gain of the amplifier 140 can be of the order of 60 dB (dependent on the frequency of operation and the design of the amplifier), so an extremely large effective capacitance can be achieved with a relatively small capacitor. Thus the capacitive circuitry can establish a constant reference voltage at the first plate of the transducer 112 (equal to the biasing voltage), and moreover can do so using components that do not take up significant area on an integrated circuit in which the circuitry 110 is embodied.

In some cases, the use of the amplifier 140 to increase the capacitance of the second capacitor 144 may be inappropriate. For example, the amplifier 140 may superimpose any input-referred noise onto the bias voltage applied to the first plate of the transducer, and hence on to the output signal. This is acceptable when measuring the capacitance of the transducer 112 (where accuracy of the quiescent capacitance measurement is more important than achieving low noise); however, it may be unacceptable for normal operation (i.e. when the transducer 112 is utilized to detect incoming pressure waves, etc). In the illustrated embodiment, therefore, the capacitive circuitry further comprises switches 148, 150 which are operable in certain modes of operation to bypass the amplifier 140. One switch 148 is coupled between the node of the first capacitor 142 not directly connected to the transducer 112 and a reference voltage (e.g. ground); the other switch 150 is coupled between the node of the second capacitor 144 not directly connected to the transducer 112 and the reference voltage (e.g. ground). In some modes of operation (e.g. normal operation), therefore, the switches 148, 150 may be closed to short the capacitors 142, 144 to ground, and the amplifier 140 disabled. In other modes of operation (e.g. capacitance measurement of the transducer 112), the switches 148, 150 may be opened and the amplifier 140 enabled.

The circuitry 110 shown in FIG. 2 may be provided on a single integrated circuit. Alternatively, the transducer 112 may be provided separately to other components of the circuitry 110 (which would then comprise respective bond pads for connection to the plates of the transducer 112). In this case, the integrated circuit providing the other components may be packaged within the same package as the transducer 112.

Figure 3:
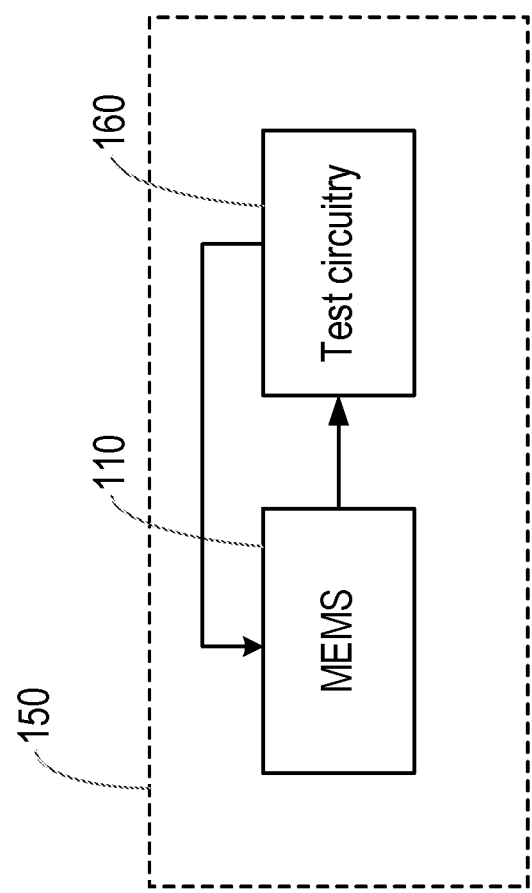
FIG. 3 shows a MEMS transducer system according to embodiments of the disclosure.

FIG. 3 is a schematic drawing of a MEMS transducer system 150 according to embodiments of the disclosure.

The system 150 comprises MEMS transducer circuitry 110 (e.g. as described above with respect to FIG. 2) and test circuitry 160. The test circuitry 160 is communicatively coupled to the MEMS transducer circuitry 110, and operable to receive one or more signals from the MEMS transducer circuitry 110, such as the output signal generated by the amplifier 124, and/or the control signals generated by the comparator circuitry 128.

The system 150 may be embodied within a single integrated circuit, i.e. both the MEMS transducer circuitry 110 and the test circuitry 160 may be embodied on the same integrated circuit, or chip. Alternatively, the system 150 may be embodied on multiple integrated circuits within the same host device (e.g. a phone, laptop or other macro electronic device). That is, the MEMS transducer circuitry 110 may be embodied on a first integrated circuit (or multiple integrated circuits, see above), while the test circuitry 160 is embodied on a second integrated circuit that is coupled to the first integrated circuit. In either case, such arrangements allow the capacitance of the MEMS transducer 112 to be determined upon manufacture and also during use, i.e. once the MEMS system 150 has been placed in an electronic device and the electronic device sold to a user. In further alternatives, the test circuitry 160 may be embodied in external circuitry that does not form part of the same integrated circuit as the MEMS transducer circuitry 110, or even the same device. For example, the test circuitry 160 may be provided at a manufacturing or test facility, and coupled to multiple MEMS transducer circuits in sequence, or as part of a manufacturing line, in order to measure the capacitance of each transducer that is manufactured.

As noted above, the period of the charge-discharge cycle is proportional to the capacitance of the transducer 112. The test circuitry 160 is thus operable to determine the period of the cycle, or a parameter that is indicative of the period (such as the frequency), and so determine the capacitance of the MEMS transducer 112 based on the determined period or parameter. For example, the test circuitry 160 may determine the period of the cycle (or a parameter that is indicative of the period) based on the output of the amplifier 124 itself, or based on the control signals generated by the comparator circuitry 128 (which will switch—from charging to discharging, and from discharging to charging—at a rate that is twice the frequency of the oscillation).

In one embodiment, the test circuitry 160 determines the period of the charge-discharge cycle itself. For example, the test circuitry 160 may comprise a counter that is coupled to receive a clock signal having a frequency that is much higher than the frequency of the oscillation in the transducer signal. The counter increments at the rate of the clock signal, and so counts the number of clock cycles in each charge-discharge cycle (so determining the period), or the number of clock cycles between a change in output of the comparator circuitry 128 (so determining half the period). This arrangement may be particularly suited to embodiments in which the MEMS system 150 is embodied within an electronic device or on a single integrated circuit. Alternatively, the number of charge-discharge cycles in a given period (sufficiently long to cover multiple cycles) may be counted and the average cycle period calculated.

Alternatively, the test circuitry 150 may comprise automated test equipment, which can determine the period or the frequency of the oscillation (or the control signals) directly. This arrangement may be particularly suited to embodiments in which the test circuitry 160 is implemented in circuitry that is external to the MEMS transducer circuitry 110.

The test circuitry 160 may be further operable to provide one or more control signals to the MEMS transducer circuitry 110, either directly or via one or more intermediate components such as processing circuitry and memory. For example, the test circuitry 160 may be operable to place the MEMS transducer circuitry 110 into a test mode, in which the current sources 130, 132 are coupled to the second plate of the MEMS transducer 112 in order to determine the capacitance. Thus the test circuitry 160 may generate control signals for one or more of: instructing the biasing circuitry 116 to generate biasing voltages for the MEMS transducer 112 (e.g. in a manner discussed in more detail below with respect to FIG. 4); coupling the comparator circuitry 128 to the output of the amplifier 124 so as to initiate the charge-discharge cycle; and de-coupling the output of the amplifier 124 from audio processing circuitry so as to prevent any audio signals resulting from the test process from reaching the user.

The test circuitry 160 may further alter the biasing voltage generated by the biasing circuitry 116 based on the determined capacitance, e.g. so as to achieve a given output signal for a given input pressure or sound wave. For example, if the capacitance is determined to be lower than some expected value (e.g. due to degradation of the MEMS transducer over time, or a minor defect in the manufacturing process, etc), the biasing voltage can be increased by a factor or some absolute amount to compensate for the lower capacitance. Similarly, if the capacitance is higher than the expected value, the biasing voltage can be decreased to compensate and so achieve a consistent output signal.

Alternatively, the test circuitry 160 may alter the gain of the low noise amplifier 124 (or some other amplifier circuitry) so as to compensate for the capacitance of the MEMS transducer and ensure a consistent output for a given input pressure or sound wave.

The test circuitry 160 may determine the capacitance of the MEMS transducer 112 in a number of different ways. For example, if values are known for the current $I_{ref}$ in the current sources 130, 132, and the upper and lower voltage thresholds $V_H$ and $V_L$ (and optionally the gain of the amplifier 124), the measured value for the period $T_{osc}$ can be used to determine the capacitance of the transducer 112 using the equation above.

Figure 4:
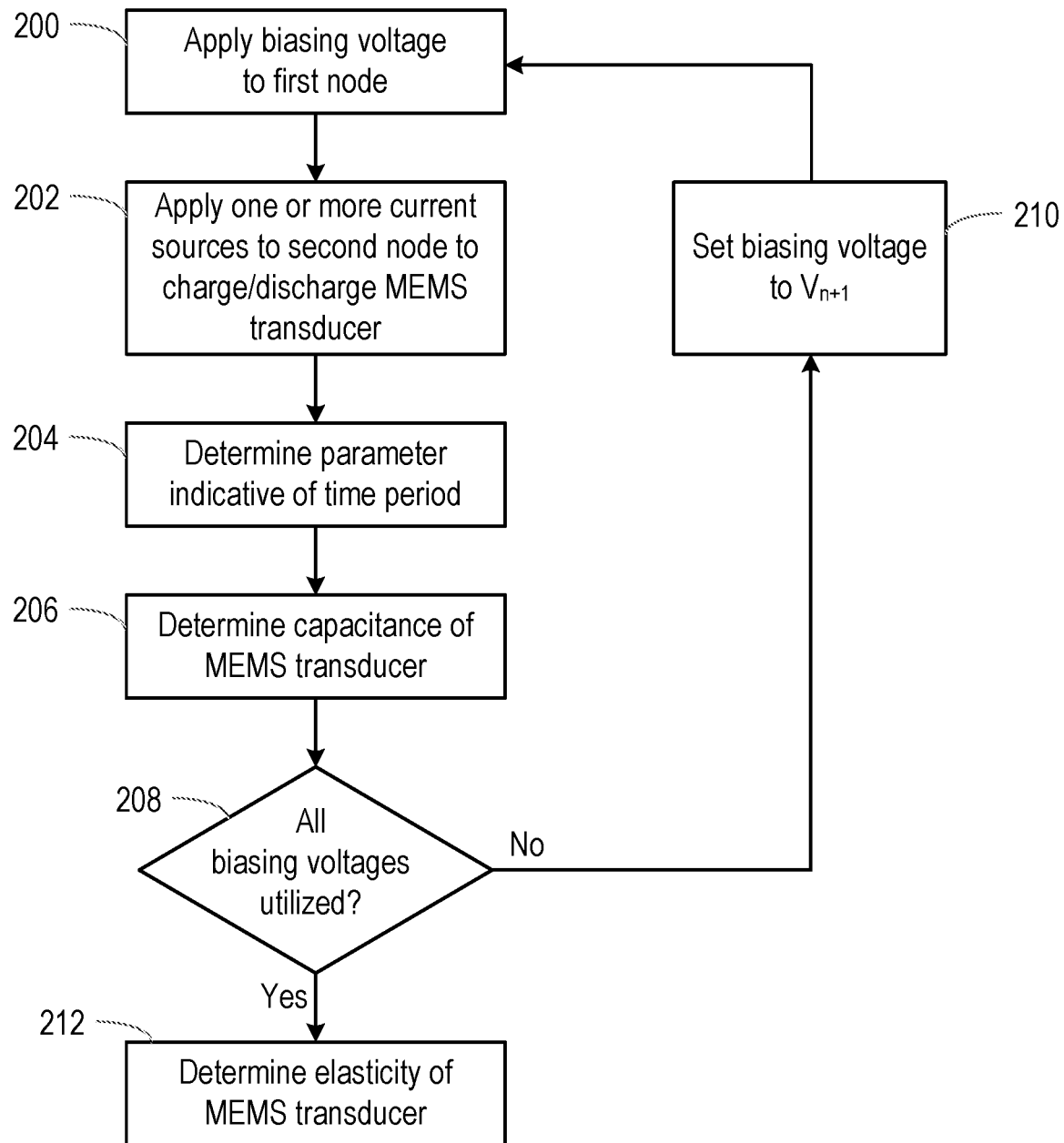
FIG. 4 is a flowchart of a method according to embodiments of the disclosure.

FIG. 4 is a flowchart of a method according to embodiments of the disclosure. The method may be performed in the MEMS transducer circuitry 110 and more generally in the MEMS transducer system 150 described above. The method may be implemented as part of the process of manufacturing the MEMS transducer circuitry 110, or during use of the MEMS transducer circuitry 110 in an electronic device (e.g. upon power up of the device).

In step 200, a test or calibration mode is entered, and a biasing voltage is generated by the biasing circuitry 116 and applied to a first node (which is connected to a first plate of the MEMS transducer 112). A second node (which is connected to a second plate of the MEMS transducer 112) is connected to a high-value (typically of the order of 10 Gohm or greater) bias resistance to bias this node to ground without shorting out the audio band signal.

In step 202, one or more current sources are applied to the second node in order to charge and then discharge the transducer (or vice versa) between upper and lower threshold voltages. Thus the transducer is charged by application of one or more current sources until the output of the transducer reaches the upper threshold voltage and, upon reaching the threshold, the one or more current sources are applied so as to discharge the transducer until the lower threshold voltage is reached (or vice versa). This process may be repeated multiple times, such that an oscillation is established in the signal that is output from the transducer.

In step 204, the time period of the charge-discharge cycle (or a parameter that is indicative of the time period, such as the frequency of oscillation or part of the time period) is determined. For example, the parameter may be determined based on the signal that is output from the transducer, or based on the switching of the one or more current sources.

In step 206, based on the measured parameter indicative of the time period, the capacitance of the MEMS transducer 112 is determined. For example, the capacitance may be determined based additionally on known values of the current flowing in the current source(s) and the upper and lower threshold voltages. Alternatively, the capacitance may be determined based additionally on a measured parameter that is indicative of the time period for a charge-discharge cycle in a reference capacitor, and the known capacitance of the reference capacitor.

In some embodiments of the disclosure, the method may end at step 206. However, it will be appreciated that the value of the biasing voltage will in general have an effect on the measured capacitance. That is, the biasing voltage that is applied to the first plate of the MEMS transducer may effectively set the "rest" position of the transducer (i.e. the distance between the first and second plates, or the position of the moveable plate with respect to the fixed plate) in the absence of incoming pressure or sound waves. As noted above, the distance between the plates affects the capacitance of the transducer, and therefore the biasing voltage that is applied in step 200 also affects the capacitance of the transducer.

In some embodiments of the present disclosure, therefore, steps 200, 202, 204 and 206 are repeated for multiple different values of the biasing voltage.

In step 208, the test circuitry determines whether the capacitance of the MEMS transducer has been determined for all biasing voltages. If not, the method proceeds to step 210 and the biasing voltage is set to a different value (e.g., if the previous value of the biasing voltage is $V_n$, the next value may be $V_{n+1}$). The method then repeats steps 200, 202, 204 and 206 to determine the capacitance of the MEMS transducer for the biasing voltage $V_{n+1}$.

The multiple biasing voltages may be set within a range of values that includes the normal operating voltage of the MEMS transducer, i.e. the biasing voltages may be set between a lower value (e.g. 1 V or even 0 V) and an upper value (e.g. 20 V), with the normal operating voltage expected to be 12 V or similar. The biasing voltages may be substantially equally spaced across the range. However, at higher biasing voltages the electrostatic forces between the plates of the transducer 112 begin to dominate the interaction of the plates, causing significant variation of the capacitance. Thus at higher voltages the steps between consecutive biasing voltages may be smaller than the steps at lower voltages. That is, in a first, lower range of biasing voltages (e.g. 0 V to 17 V) the steps between the applied biasing voltages may be set to a first value (e.g. 2 V); in a second, higher range of biasing voltages (e.g. 17 V to 20 V) the steps between the applied biasing voltages may be set to a second, smaller value (e.g. 0.5 V). At these higher voltages, the changes in capacitance of the MEMS transducer with biasing voltage can thus be measured more closely.

The different values of capacitance for different biasing voltages can be used in a number of different ways. In one embodiment, the values are used to determine an appropriate biasing voltage to be applied to the first node of the MEMS transducer during use. That is, the biasing voltage that achieves a desired capacitance value can be selected as the biasing voltage to be used in further use of the MEMS transducer.

In another embodiment, the values may be used in step 212 to determine an elasticity of the MEMS transducer 112 (i.e. an elasticity of the moveable membrane). That is, the capacitance of the transducer is measured at a plurality of different voltages, while the membrane is stationary. At such an equilibrium, the elastic restorative force (which acts to restore the membrane to its resting position in the absence of biasing voltage) is equal and opposite to the electrostatic force arising from the biasing voltage, attracting the plates of the transducer towards each other. The elastic restorative force may be given by an elasticity constant multiplied by the displacement of the membrane from its resting position. By measuring the capacitance of the transducer at multiple biasing voltages, the elasticity of the membrane may be extracted via numerical or graph-fitting methods. The determined elasticity may then be utilized to alter the biasing voltage of the MEMS transducer circuitry during normal operation, or the gain of the low-noise amplifier, so as to compensate for changes in the elasticity of the membrane over time.

Embodiments of the present disclosure thus provide methods and apparatus for determining the capacitance of a MEMS transducer. The methods can be applied as part of the manufacturing process, or later during use of the MEMS transducer in an electronic device. The determined value of the capacitance can be used to calibrate the MEMS transducer circuitry so as to achieve a given output signal for a given input pressure or sound wave.

The disclosed techniques have particular advantages for integrated MEMS transducers (i.e. where MEMS transducers are integrated on the same circuit as electronic circuitry such as biasing circuitry, amplifying circuitry, etc). In such systems it is otherwise difficult to measure the transducer capacitance, as an additional bond to one of the transducer plates (from which the capacitance may be measured) would add significant parasitic capacitance to that node.

The skilled person will recognise that some aspects of the above-described apparatus and methods, for example the discovery and configuration methods may be embodied as processor control code, for example on a non-volatile carrier medium such as reprogrammable memory (e.g. Flash), a disk, CD- or DVD-ROM, programmed memory such as read-only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may comprise or be comprised in an electronic device, especially a portable and/or battery powered electronic device such as a mobile telephone, an audio player, a video player, a PDA, a wearable device, a mobile computing platform such as a smartphone, a laptop computer or tablet and/or a games device, remote control device or a toy, for example, or alternatively a domestic appliance or controller thereof including a home audio system or device, a domestic temperature or lighting control system or security system, or a robot.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. A system, comprising:
   a MEMS capacitive transducer, comprising one or more first capacitive plates coupled to a first node and one or more second capacitive plates coupled to a second node;
   biasing circuitry coupled to the first node, operable to provide a biasing voltage to the one or more first capacitive plates;
   output circuitry coupled to the second node, for generating an output signal; and
   capacitive circuitry coupled to the first node, comprising a charge amplifier arranged in a feedback loop, the feedback loop further comprising a first capacitor coupled to an output of the charge amplifier, such that an effective capacitance of the first capacitor is increased based on a gain of the charge amplifier, wherein the first capacitor and an inverting input of the charge amplifier are further coupled to the first node.

2. The system according to claim 1, wherein the inverting input of the charge amplifier is coupled to the first node via a second capacitor.

3. The system according to claim 1, wherein a non-inverting input of the charge amplifier is coupled to a reference voltage.

4. The system according to claim 1, wherein the capacitive circuitry further comprises a resistive element coupled between the output of the charge amplifier and the inverting input of the charge amplifier.

5. The system according to claim 1, further comprising one or more switches operable to selectively couple and decouple the charge amplifier from the feedback loop.

6. The system according to claim 5, wherein the one or more switches are operable to couple the charge amplifier to the feedback loop in a first mode of operation for measurement of a capacitance of the MEMS capacitive transducer.

7. The system according to claim 5, wherein the one or more switches are operable to decouple the charge amplifier from the feedback loop in a second mode of operation of the system.

8. The system according to claim 1, wherein the effective capacitance of the first capacitor is increased via the Miller effect.

9. The system according to claim 1, wherein the biasing circuitry comprises a charge pump coupled to the first node.

10. The system according to claim 9, wherein the biasing circuitry further comprises a filter arranged between the charge pump and the first node, for filtering high-frequency noise from the charge pump.

11. The system according to claim 1, further comprising:
    test circuitry coupled to the second node, operable to:
    selectively apply one or more current sources to the second node, so as to charge and discharge the MEMS capacitive transducer and so vary a signal based on a voltage at said second node between an upper value and a lower value;
    determine a parameter that is indicative of a time period of the variation of the signal; and
    determine a capacitance of the MEMS capacitive transducer based on the parameter that is indicative of the time period.

12. The system according to claim 1, embodied on a single integrated circuit.

13. An electronic device, comprising:
    a system as claimed in claim 1.

14. The electronic device according to claim 13, wherein the electronic device is one of: a portable electronic device; a battery-powered electronic device; a mobile telephone; an audio player; a video player; a PDA; a wearable device; a mobile computing platform; a smartphone; a laptop computer; a tablet computer; a games device; a remote control device; a toy; a domestic appliance; a controller of a domestic appliance; a home audio system or device; a domestic temperature or lighting control system; a security system; and a robot.

15. A system, comprising:
a MEMS capacitive transducer, comprising one or more first capacitive plates coupled to a first node and one or more second capacitive plates coupled to a second node; and
capacitive circuitry coupled to the first node, comprising a charge amplifier and a first capacitor coupled to an output of the charge amplifier, and arranged such that an effective capacitance of the first capacitor is increased via the Miller effect based on a gain of the charge amplifier, wherein the first capacitor and an inverting input of the charge amplifier are coupled to the first node.

16. The system according to claim 15, wherein the inverting input of the charge amplifier is coupled to the first node via a second capacitor.

17. The system according to claim 15, wherein the capacitive circuitry further comprises a resistive element coupled between the output of the charge amplifier and the inverting input of the charge amplifier.

* * * * *